United States Patent
Swinehart

(10) Patent No.: US 6,200,385 B1
(45) Date of Patent: Mar. 13, 2001

(54) CRUCIBLE FOR GROWING MACROCRYSTALS

(76) Inventor: Carl Francis Swinehart, 4102 Silsby, University Heights, OH (US) 44118-3318

( * ) Notice: Subject to any disclaimer, the term of this patent is extended or adjusted under 35 U.S.C. 154(b) by 0 days.

(21) Appl. No.: 09/528,834

(22) Filed: Mar. 20, 2000

(51) Int. Cl.⁷ .............................. C03B 13/14; F27B 14/10
(52) U.S. Cl. .................. 117/220; 117/221; 117/223; 117/900; 117/940; 432/262; 432/264; 432/265; 422/908
(58) Field of Search ................................ 117/81, 83, 220, 117/221, 223, 900, 940; 432/262, 264, 265; 422/908

(56) References Cited

U.S. PATENT DOCUMENTS

| | | | |
|---|---|---|---|
| 3,282,641 | 11/1966 | Sfiligo et al. | 423/21.1 |
| 3,944,393 | * 3/1976 | Schierding et al. | 117/223 |
| 4,946,542 | * 8/1990 | Clemans | 117/83 |
| 5,116,456 | * 5/1992 | Nestor | 117/83 |
| 5,476,679 | 12/1995 | Lewis et al. | 427/122 |
| 5,911,824 | 6/1999 | Hammond et al. | 117/81 |
| 5,997,640 | 12/1999 | Berthold et al. | 117/200 |

* cited by examiner

*Primary Examiner*—Benjamin L. Utech
*Assistant Examiner*—Donald L. Champagne
(74) *Attorney, Agent, or Firm*—Alfred D. Lobo

(57) ABSTRACT

A crucible 40 having an inner surface 42 not wetted by a melt which shrinks when it solidifies is provided with indentations 41 in the walls of the crucible to support an ingot grown in it. Supporting the crystal provides a gap between the bottom of the ingot 44 and the inner surface of the bottom of the crucible. The gap allows more uniform heat transfer from the bottom of the crucible than is provided when there is no gap; the gap provides a controllable temperature gradient between the interior and exterior of the crucible. To direct propagation of the growth of a macrocrystal, the bottom of the crucible is provided with at least one set of multiple grooves in parallel relationship with each other. Preferably a second set of multiple grooves in parallel relationship with each other intersect the grooves of the first set at an angle chosen depending upon the lattice structure of the macrocrystal to be grown. A macrocrystal grown in a crucible with twin sets of angulated grooves produces single crystals.

7 Claims, 5 Drawing Sheets

CRUCIBLE FOR GROWING MACROCRYSTALS

BACKGROUND OF THE INVENTION

This invention relates to a crucible for growing large macrocrystals (or ingots or boules) from a melt in a highly modified Stockbarger type furnace, or a comparable one in which slow growth of a solidifying macrocrystal from the melt under the influence of the earth's gravity, results in the solidified macrocrystal being supported within the walls of the crucible. An ideal macrocrystal is a single crystal, but typically it is only optically monocrystalline, being formed of several crystals demarcated by boundaries within the macrocrystal. Grain boundaries within a large macrocrystal (an ingot) which are discontinuities are undesirable.

More specifically the novel crucible is useful to grow crystals of halides of an element of Group 1a and Group 2a of the Periodic Table, particularly the alkali metal fluorides and alkaline earth metal fluorides, lead fluoride and crystals of the foregoing which are doped with desirable metal ion dopands. High quality macro-crystals of fluorides of lithium and sodium, as well as of magnesium, calcium, barium and strontium have been produced commercially since soon after 1939 when Donald Stockbarger disclosed a method for their manufacture in U.S. Pat. No. 2,149,076 and we taught methods for purifying melts in U.S. Pat. Nos. 2,498,186 and 2,550,173. However, producing high quality macrocrystals depends upon many factors, including having the skills required to duplicate successful runs. Success depends upon anticipating the need for minute adjustments in "power hours" (rate at which power is delivered to heat the melt), among others, all of which adjustments must be made before a probe inserted in the melt shows any indication of a change in the rate of growth.

To date, a graphite crucible may be used for growing a Stockbarger macrocrystal provided the graphite is not so porous as to allow the melt to leak through it. A crucible may have an inclined or flat bottom and either might be provided with a well for a "seed crystal" holder.

U.S. Pat. No. 5,911,824 teaches that a particular graphite crucible could not contain a melt of thallium iodide doped sodium iodide, NaI(Tl) (see col 4, lines 26–34). A NaI(Tl) crystal was successfully grown in a graphite crucible coated the inside surface of which is coated graphitic pyrolitic carbon, and the crystal did not adhere to the coated surface (see col 4, lines 36–47).

It is preferred to use a 9RL grade graphite manufactured by Airco Carbon after it is cleaned with a 44% HI solution, rinsed with deionized water, and heated to 400–500° C. for a full day to dry it. It has a generally tapered trapezoidal or conical bottom, the width of the bottom being much less than that of the top of the crucible, primarily due to considerations of strength. It is a characteristic of macrocrystals of the aforementioned fluorides of melt-grown metal or metal-like elements, that they shrink when they solidify (referred to herein as "shrinking melts"), and the first crystal grown was readily removed because the walls were not wetted by the melt. However, a second crystal grown in the same crucible, adhered strongly to the crucible and could not be removed in its entirety without a remelting procedure (see col 4, lines 60–66). If the crystal was grown in a platinum crucible, the crystal adheres to the platinum. The platinum crucible must be heated to melt the surfaces of the crystal in contact with the platinum (referred to as "remelting") before the platinum crucible may be slid off the crystal.

To be readily removed, sufficient shrinkage must occur when the melt solidifies. Since the coefficient of linear expansion of graphite is about 7.85 microinches/(inch)(° C.) measured at about 40° C., that of the salt must be greater, preferably at least 5% greater, and more preferably 10% greater. The coefficient of fluorspar is about 19.5 microinches/(inch)(° C.) measured at about 40° C., so that even in a relatively small crucible having an inside diameter in the range from about 5 cm to about 25 cm, the circumferential surface of the solidified crystal pulls away from the inner walls of the crucible, and the crystal may be lifted out of the crucible with a vacuum cup without breaking the crystal or crucible, even when the crucible is cylindrical and its sides are vertical. This may be done provided the surface tension of the melt is high enough and does not wet the surface of the graphite, and not to seep into its pores. Note that the linear coefficients of expansion at melt temperature will likely be substantially different from those given above.

The effect of such shrinkage on a crystal no larger than about 7.5 cm at its greatest diameter (referred to as a 7.5 cm diameter macrocrystal) is not particularly notable even if the shrinkage is not controlled, but for larger crystals that effect is; the larger the crystal, the more detrimental are the effects of such uncontrolled shrinkage.

Using a shrinking melt to grow a Stockbarger macrocrystal from a melt typically comprises slowly moving the melt at a controlled rate from a region hotter than its solidification temperature to a region cooler than its solidification temperature, controlling the relative temperatures of the regions, and maintaining a temperature gradient in a localized zone between the regions at the boundary of the melt. The temperature gradient in the zone is sufficient to allow melt to crystallize at the cooler boundary of the localized zone. An "elevator" type furnace may be used where the crucible is raised or lowered on an elevator; or a "movable temperature gradient" furnace may be used where the furnace is moved and the crucible is stationary. The gradient between melt near the top of a crystal and the sharply localized zone is in the range from about 100° C. to about 500° C. depending upon the particular halide.

It will be evident that the temperature of the edge portion of successive layers of the melt corresponds to the solidification temperature of the melt as these edge portions reach a substantially fixed location in the path of travel of the melt and solidification begins and progresses inwardly. Preferred crystals are obtained when the zone of solidification approximates a plane. It is desirable to control the rate of heat flow through the inner portion of the melt from the hotter to the cooler region. If the rate of heat flow through the inner portion of the melt is too slow, the zone of solidification tends to be concave. Properly controlling the rate of heat flow through the inner portion of the melt allows the zone of solidification to approximate a plane.

To date, the art has addressed the problem of a macrocrystal adhering to the inner surface of the crucible by either providing a very smooth microporous graphite surface, or by coating the surface of the graphite as in the '824 patent, or by lining a mechanically stable temperature resistant material such as alundum or graphite with a thin sheet of platinum as in U.S. Pat. No. 5,997,640. In either case, the better is the separation upon solidification, the more readily the macrocrystal falls to the bottom of the crucible. In a crucible in which the porosity is such that the melt seeps into the pores for a short distance sufficient to hold the weight of the crystal, the bottom of the solidified crystal pulls away from the bottom of the crucible, leaving a bottom gap. In many instances the seepage is insufficient to support the weight of the crystal in the walls of the crucible and the crystal will suddenly drop to the bottom of the crucible closing the gap.

SUMMARY OF THE INVENTION

It has been discovered that when a macrocrystal is grown from a shrinking melt in a crucible having an inner surface which is not wetted by the melt, solidified melt shrinks away from and separates from the sides and bottom of the crucible in earth's gravity. After initial solidification causes this separation, it forms a barrier against flow of heat out of the bottom of the crucible while the rest of the crystal is being formed. The separation reduces the temperature gradient between the regions; a steep temperature gradient causes strain or lattice slippage which affects the optical quality of the solidified crystal. Better cooling is obtained if the macrocrystal is grown in a smooth-walled cylindrical crucible with non-wetted walls, and the solidified macrocrystal comes to rest on the bottom of the crucible; but by then the damage is done because the gradient could not have been controlled. Better cooling is not obtained if the crystal is grown in a crucible with a cylindrical upper portion and a tapered lower portion and non-wetted walls, because the solidified macrocrystal slides towards the bottom until it is supported by the stepped circumferential shoulder of the crucible's conical bottom, leaving a gap between the lower surface of the crystal's conical bottom, and the corresponding conical surface of the crucible's bottom. Again, the damage is done because in either case, the ability to cool the solidified crystal and reliably maintain a controllable temperature gradient between the regions at the boundary of the melt, is jeopardized.

It is therefore a general object of the invention to provide a crucible in which the walls support the weight of a directionally solidified macrocrystal, irrespective of the geometrical shape of the interior of the crucible; because it is critical that the melt fails to wet the walls of the crucible, the weight of the growing crystal is supported by the walls of the crucible, the separation between the lower surface of the macrocrystal and the bottom of the crucible is maintained, and loss of heat through the bottom of the crucible is controlled.

It is a specific object of this invention to provide either a unitary (or monolithic), or a disassemblable crucible made of a material inert with respect to a melt to be solidified, the material having a melting point substantially greater than that of the melt; the crucible is preferably of graphite or carbon, or a substitute for either, able to withstand temperatures required to melt the material to be grown; the crucible's walls which are essentially non-wetted by the melt, have indentation means to support a grown ingot; the configuration of the indentations is such as to provide sufficient support for the weight of solidified melt in a region below the indentations. An indentation means may be a generally lateral projection (referred to as a "step") from the interior surface of the crucible, or it may be a channel-like recess (referred to as a "channel") formed in the interior surface. The lateral width of a step or channel is empirically selected to be in the range from about 0.1% to about 1.5% of the diameter of the crystal, preferably about 1%. When the macrocrystal grown is not circular in cross-section at its widest dimension, the term "diameter" refers to the widest dimension of the macrocrystal. Graphite and carbon are practical materials for a crucible and may be coated with pyrolitically deposited carbon to decrease wetting.

Because it is not possible to see what is occurring while the crystal is growing, a crucible having indentations in its inner walls to support the weight of the growing crystal provides the advantage of being able to predict the power requirement as a function of time at each point during the growth of an ingot; and to repeat a cycle for reliably growing desirable ingots.

It is another general object of this invention to provide a crucible with a grooved or serrated bottom surface, the grooves or serrations either (i) running parallel to each other in only one direction, or (ii) running parallel to each other in two directions at an angle, one parallel set being typically at either 60° or 90° to the other parallel set, the angle chosen depending upon the desired direction of crystal growth propagation; preferably growth is in the 100 direction, but if seeded, may be in the 111 direction; though the side elevational profile of a groove is not narrowly critical, the sides of each groove are preferably angulated rather than vertical, to facilitate separation of the crystallized bottom surface of a crystal; grooves in the bottom surface of the crystal enhances the performance of scintillation detectors and optical light pipes.

It is a specific object of this invention to provide a crucible in which the bottom is provided with patterns of twin sets of grooves in each semicircle of the bottom, the pattern in one semicircle being spaced apart from the other by a small distance in the range from 1 mm to about 1 cm, so as to grow side-by-side single crystals in the ingot.

BRIEF DESCRIPTION OF THE DRAWING

The foregoing and additional objects and advantages of the invention will best be understood by reference to the following detailed description, accompanied with schematic illustrations of preferred embodiments of the invention, in which illustrations like reference numerals refer to like elements, and in which.

DETAILED DESCRIPTION OF PREFERRED EMBODIMENTS

Figure 1:
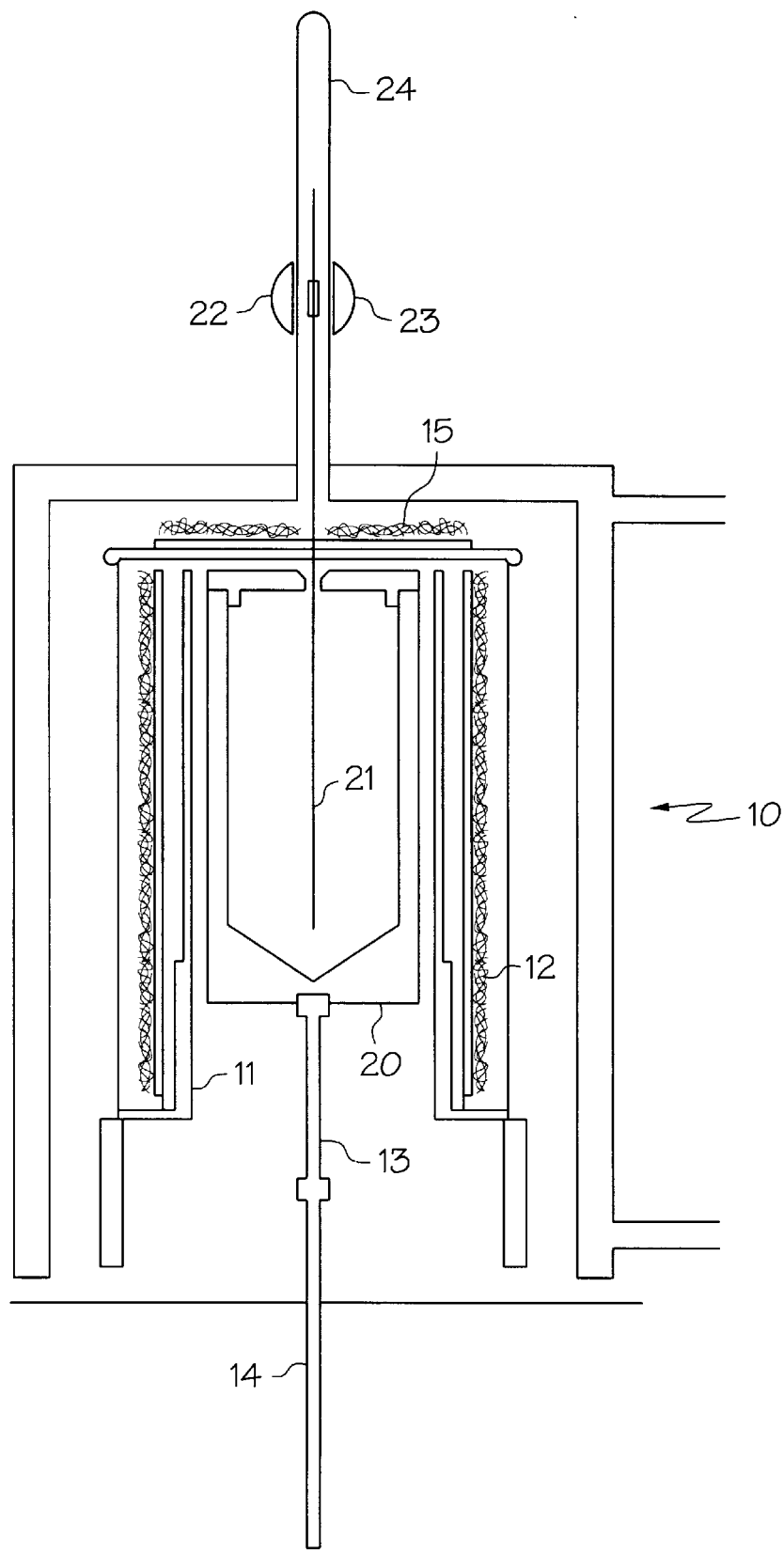
FIG. 1 is a generally schematic view of a typical prior art furnace in which a graphite crucible is used to grow a macrocrystal.

Referring to FIG. 1, there is diagrammatically illustrated a furnace referred to generally by reference numeral 10, in which is reciprocably held a crucible 20 charged with substantially pure small crystals of an aforementioned halide, e.g. calcium fluoride ($CaF_2$) with from 2% to 4% by weight of lead fluoride ($PbF_2$). The crucible is specifically designed for the growth of macrocrystals larger than about 7.5 cm, and preferably for crystals larger than about 30 cm in diameter at its largest diameter. A larger crystal may be grown, as large as 80 cm wide or more, at its widest dimension in the lateral direction, the limit being determined by the size of the furnace one can build, and the cost of constructing a crucible of that size. The emphasis is on growing a large crystal, referred to as an ingot, in a crucible having at least one interior dimension greater than 7.5 cm, and, the interior surface has two transversely spaced apart indentations having a configuration adapted to support said macrocrystal near its edges and maintain said macrocrystal's bottom in spaced apart relationship with said crucible's bottom. Such a crucible allows one to grow an ingot with a large diameter; the height of an ingot is arbitrary, depending upon the depth of melt in the crucible and the height of the furnace. The height of an ingot is typically in the range from about 7.5 cm to 30 cm.

The material of a preferred crucible is heat resistant and thermally conductive, such as microporous graphite or carbon having a pore size too small to allow penetration of a particular melt being solidified. The graphite may be coated with glassy carbon by techniques well known in the art, the requirement being that the crucible formed is dense enough to prevent leakage of the melt, that is, essentially impermeable to the melt. The lower the surface tension (dynes/cm) of the melt, the higher is the required density of the graphite.

A crucible made from graphite of appropriately high density may be sectioned, and the mating surfaces of the sections machined smoothly enough that when reassembled, the crucible behaves like a monolithic crucible, and does not leak. A crucible larger than about 30 cm in diameter may be constructed with circumferentially segmented sections having dove-tailed sides which are interfitted in the vertical plane. The dove-tailed boundaries are preferably cemented with graphite. The surface tension of the melt used is high enough that the melt will not seep through the interface of abutting sections. This physical phenomenon is used to construct crucibles which can be taken apart to remove the ingot grown in it, and because the crucible is disassemblable, the shape and the size of the ingot grown may be arbitrarily chosen.

Typical melts and their surface tensions are as follows:

| Salt | Temp. ° C. | dynes/cm |
| --- | --- | --- |
| NaI | 700 | 85.6 |
| CaI | 654 | 73.1 |
| KCl | 800 | 95.8 |
| NaCl | 803 | 113.8 |
| NaF | 1010 | 199.5 |
| LiF | 868.5 | 249.5 |
| $PbF_2$ | 855 | (185) |
| $CaF_2$ | 1330 | (255) |
| $BaF_2$ | 1280 | (369) |

The extent of shrinkage upon crystallization depends upon (i) the width of the crystal grown in the lateral plane in which the crystal is to be supported, the width being greater than the distance between opposed points of support; and (ii) the coefficient of expansion of the material crystallized. Calculating the extent to which each indentation or step should protrude into the crucible from known coefficients of expansion, it will be evident that extent will be in the range from about 0.05 mm to about 5 mm depending upon the diameter of the crystal.

Furnaces for the growth of large crystals have two positions for the growth of the interface for each power level. Also the power needs to be increased as growth proceeds. The change from a smooth hard interface to dendritic trees can make as much as 60 mm difference in probe readings for the same power level if in some way the residual melt is stirred. The rate of crystallization for dendritic needles is orders of magnitude greater than the rate for formation of a smooth interface, sometimes about 1000 times greater. This speed is used to spread solid and avoid the start of separate components and minimize flaws in the ingot.

Some flaws at some boundaries between components are evidenced by:

(1) A "veil" of rectangular negative crystals, voids about 100 $\mu$m at an edge, which do not strain the surrounding solid (lack of strain is visible with polarized light). Such voids result when a horizontal "bubble pipe" has moved up just below the growth interface at a boundary between components.

(2) Component boundaries may be mechanically sound but reflect some light when a veil of very small dust particles about 1 $\mu$m in size, accumulate in the boundaries. Thermal shrinkage in such a case causes small cleavages around each dust particle. The amount of light reflected from boundaries of the cleavages greatly amplifies their size.

(3) In a doped crystal, when the rejection ratio is high, typically in the range above 25, and particularly when greater than 50, dopand will accumulate at some boundaries between components. This accumulation reduces the melting temperature at the boundary enough to allow liquid to flow out of the ingot if the ingot is "melted out" of a crucible. Such flow out of the ingot may leave an opening about 2 mm wide in the ingot.

Within insulated walls 12 of the furnace are electrically heated coils 11 surrounding the crucible 20 which is supported on a vertically reciprocable graphite shaft 13 which is coupled to a water-cooled stainless steel shaft 14. An insulated cover 15 over the insulated walls 12 sealingly enclose the interior of the furnace. The interior of the furnace is flooded with an inert gas maintained under reduced pressure. Typically a getter is added to the crystalline charge in the crucible and the contents melted. A probe 21, controlled by opposed magnets 22, 23 on either side of a glass tube 24, is lowered into the crucible so that its tip can "feel" when crystallization commences. The crucible is then moved downwards under controlled conditions of temperature to establish a localized zone in which crystallization occurs; this zone is moved upwards as the crucible is moved downwards on shaft 13 until all the melt solidifies into an ingot. The construction of the furnace is conventional and forms no part of the invention claimed herein.

At plural locations, as the crucible is being lowered, the power to the heating coils must be modulated to maintain the solidifying surface of the melt at a chosen level either by decreasing or increasing the power to the coils. Such adjustment must be made long before the effect of the adjustment can be registered by the tip of the probe 21. When the ingot is fully crystallized it shrinks in the range from about 0.05% to about 2%, typically about 0.1% radially and vertically, depending upon the crystalline material. The foregoing is routine procedure for growing a crystal by modulating the power to the coils relying on the experience of a previous run; except that any shift in the position of the crystal which is different from the shift in the one grown before, results in incorrect modulations and an undesirable crystal.

Figure 2:
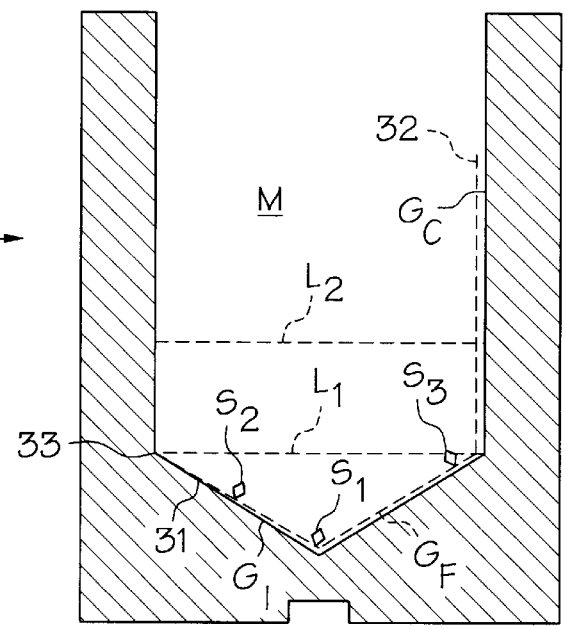
FIG. 2 is an enlarged view of a prior art conical-bottomed crucible conventionally used in the furnace shown in FIG. 1.

Referring to FIG. 2 there is shown an enlarged cross-sectional view of a conventional crucible 30 of dense graphite not wetted by the melt M, the crucible having a conical bottom 31 with tapered surfaces meeting the vertical walls 32 at a circumferential shoulder 33. Crystallization typically starts in the apex of the cone at S1, though other seeds S2, S3 etc. may initiate growth at points in the conical bottom surface and eventually generate boundaries which may run in the same direction, generally vertically in the macrocrystal to be formed. As the localized zone of crystallization rises into the shoulder 33 to a level represented by phantom line L1, the conical bottom portion of the crystal separates from the bottom surface 31 and the weight of the melt and that of the crystalline conical bottom is supported on the shoulder 33, leaving an initial gap (shown enlarged) Gi shown on the left hand side of the cone. This gap Gi is wedge-shaped, closing at the shoulder where the crystal is supported, while the melt in contact with the upper portion of the wall of the crucible continues to crystallize. As crystallization continues and the localized zone rises to a level represented by phantom line L2, the crystal continues to shrink isotropically (in each direction) and when crystallization is complete, the entire circumference of the crystal shrinks producing a final gap on the bottom, the final gap indicated by Gf on the right hand side of the cone. Since the circumferential shrinkage of the cylindrical upper portion of the ingot produces a circumferential gap Gc, the ingot is no longer supported at the shoulder and falls into contact with the conical bottom 31.

Since one cannot see or otherwise determine at what point in the growth of the ingot the radial shrinkage of the upper portion of the ingot is sufficient to drop the crystal to the bottom of the crucible, it will be evident that one cannot determine the rate of heat transfer from the lower portion of the crucible. If either the initial gap Gi or the final gap Gf could be maintained after it is formed, then the rate of heat transfer from the bottom can be determined by a little trial and error such as one skilled in the art is accustomed to do. Once determined, the rate will be identical for each ingot grown from a melt of the same salt, in the same crucible, in the same furnace.

Once the upper portion of the melt crystallizes, circumferential shrinkage precludes the initial gap Gi being maintained, but with the novel configuration of the crucible described herein, the final gap Gf can be maintained. This is accomplished when the wall of the crucible is indented or stepped, sufficiently to bear the weight of the crystal.

Figure 3:
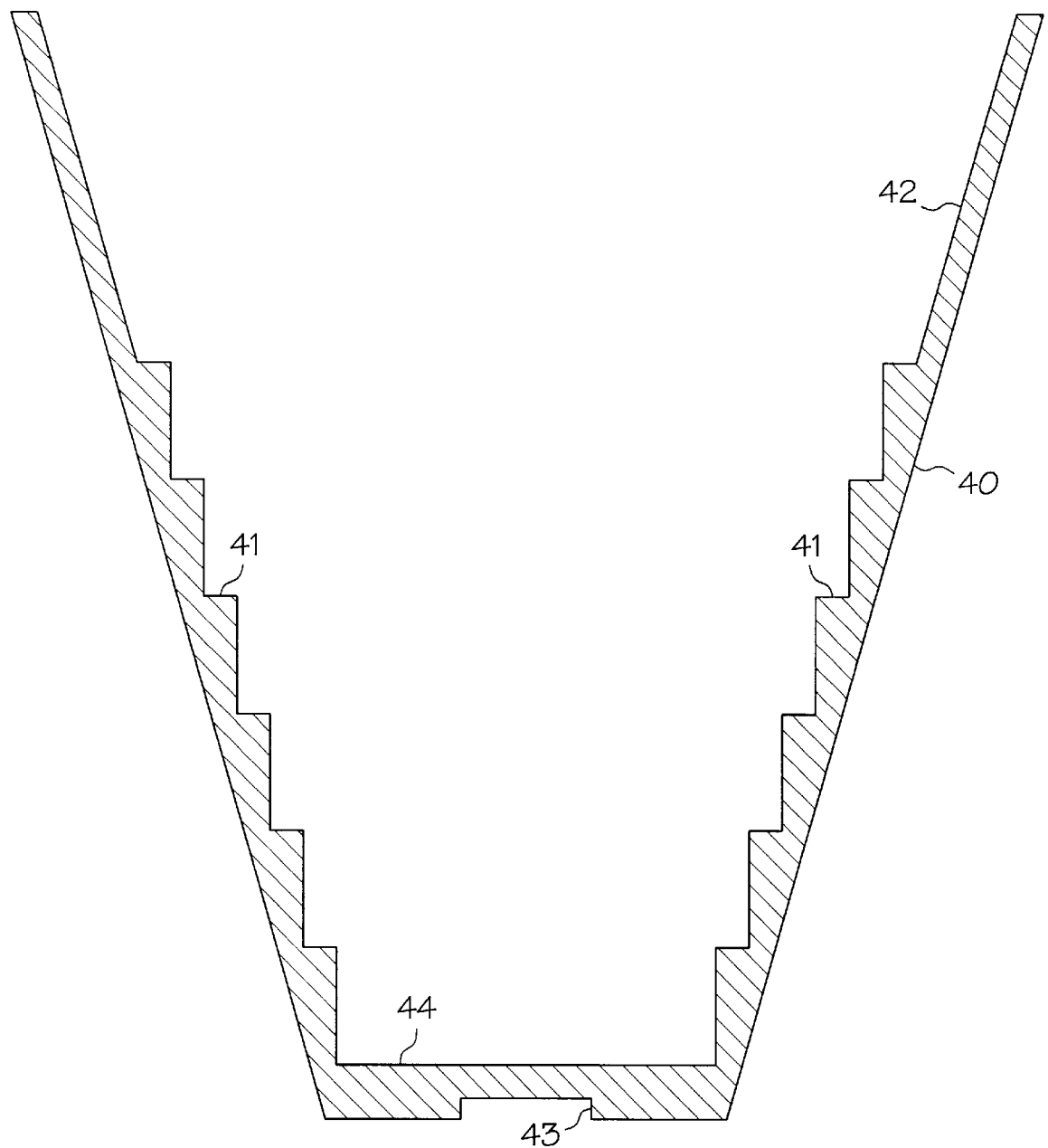
FIG. 3 is a sectional view of a crucible having a frustoconical bottom with a tapered wall having stepped indentations ("steps") in the form of circumferential steps cut into the interior surface. The term "indentation" is used to refer broadly to any projection or recess in the wall of a crucible able to support the ingot to space its bottom away from the bottom of the crucible; the term "step" indicates that the ingot may be removed without disassembling the crucible; the term "recessed indentation" or "channel" is used to indicate that the crucible must be disassembled when the ingot is to be removed.

Referring to FIG. 3 there is diagrammatically illustrated a frustoconical crucible 40 with successive vertical steps 41 formed in the interior surface of the conical wall 42. The bottom of the crucible 44 is typically much thicker than the walls of the crucible to provide adequate strength; the bottom is provided with a central recess 43 adapted to have snugly fitted therein the top of the shaft 13. For a relatively small ingot in the range from about 10 cm to about 20 cm at its maximum width, a single step intermediate the top and bottom of the grown crystal may suffice, but plural steps are preferred for larger crystals, the number of steps depending upon the size. For crystals larger than 20 cm in diameter, in the range from 2 to 10 steps may be used. In each case, the crystal is supported so as to leave a reproducible gap between the bottom of the crystal and inner surface of the bottom of the crucible. If desired a seed crystal holder (not shown) is provided in the bottom. After the crystal is grown, it rests on the steps having pulled free of the interior wall, so that the crystal can be lifted straight up and out of the crucible.

Circumferentially continuous steps are easily machined but the steps may be discontinuous; furthermore the length of the circumferential arc over which a step extends is not narrowly critical as long as it provides the desired support for the ingot grown. For practical reasons steps are provided on opposed walls to provide balanced and maximum support, but the steps may provide adequate support if they are only circumferentially spaced apart in the same lateral plane a cylindrical or frustoconical crucible. The steps may also provide adequate support if they are spaced apart in offset lateral planes, one plane above the other; if so spaced apart, it is evident they will provide optimum support if they are directly opposed to one another. Thus when a rectangular ingot is grown, it may be supported at adjacent sides, but will preferably be supported at opposed sides. Similarly, when a cylindrical or frustoconical ingot is grown it is preferably supported on at least two steps 41 and 41' (see FIG. 6), or supported in channel-like recesses, diametrically opposite from each other. The distance to which the steps 41, 41' protrude into the interior of the crucible will be in the range from about 0.1% to about 1.5% of the distance between the steps, the protrusion depending upon the shrinking melt being grown, and the location of the steps relative to one another. The ingot may also be adequately supported if the two indentations were not diametrically oppositely disposed, that is, one indentation is laterally spaced apart from the other within another quadrant as are steps 42' and 42" in FIG. 7, and the second support may be in the same lateral plane of different. Preferably the crystal will be supported at three laterally spaced apart indentations, as shown at 42, 42' and 42" in FIG. 7. Thus it is seen that adequate support may be provided as long as there are at least two indentations which are transversely spaced apart in the interior surface of the crucible. Most preferably an ingot is grown in a frustoconical crucible such as in shown in FIG. 3, which crucible is provided with a continuous circumferential step forming a ring in the interior surface.

Figure 4:
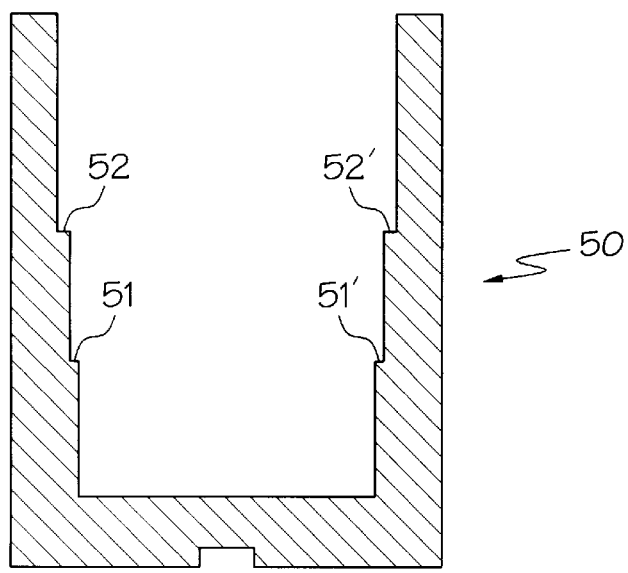
FIG. 4 is a sectional view of a generally cylindrical crucible having stepped indentations in the forms of circumferential steps cut into the vertical walls.

Though a cylindrical ingot is typically grown in a crucible illustrated in FIG. 2, or a frustoconical ingot is grown in one illustrated in FIG. 3, it is now possible to grow a rectangular ingot if desired. Referring to FIG. 4 there is shown a vertical sectional view of a box-shaped crucible 50, the interior of which is the shape of a rectangular parallelpiped, except that opposed walls are symmetrically stepped, the opposed walls having coplanar steps 51 and 51' of the same height and protruding into the interior to about the same extent, directly opposed to one another; these steps may extend for only a short distance in the range from about 5 mm to about 10 cm along a wall, or the steps may be coextensive with each opposed side. If desired, additional steps 52, 52' may be provided, each protruding inwardly to support the growing ingot, provided the steps 52, 52' do not interfere with removal of the crystallized ingot. As before, the disposition of the steps is not critical so long as the ingot is supported so as to leave a substantially reproducible gap between the bottom of the crystal and inner surface of the bottom of the crucible.

As with the crucible illustrated in FIG. 3, it is not critical that the steps 51, 51' in the sides of the crucible 50 be coplanar to provide adequate support; they may be staggered, that is vertically offset, one in a lateral plane above the other.

Figure 5:
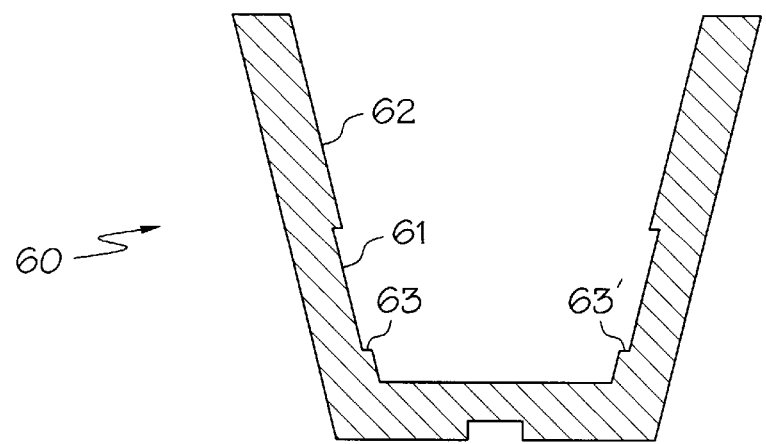
FIG. 5 is a sectional view of a crucible having a frustoconical shape in the tapered interior wall of which a single circumferential indentation or channel is provided.

In each of the crucibles illustrated in FIGS. 2, 3 and 4 the ingot may be removed without disassembling the crucible, simply lifting the ingot out. Referring to FIG. 5 there is shown a side elevational view of one-half of a frustoconical crucible 60, the other half of which is in mirror-image relationship with the one-half. The mating surfaces of each half of the crucible are smoothly polished so they may be held together tightly enough not to allow melt to seep through. Alternatively, the sides of each half may be dovetailed so they can be interfitted in fluid-tight connection, the fluid being melt. Each half has a circumferential, recessed indentation or channel 61 formed in the conical surface of the interior, the steps 63 and 63' being sized to support the crystal and maintain a bottom gap after the bottom has crystallized. The height of the channel 61 above the bottom of the crucible is not narrowly critical and the channel may extend for only a portion of the circumference, sufficient to provide the support needed. The main advantage of using a disassemblable crucible 60 with a channel 61 is that the walls of the crucible do not have to be as thick as they would be if the crucible was stepped.

To grow a very large ingot, greater than 50 cm in its widest dimension, it may be desirable to divide the crucible into several interfittable sections, irrespective of the shape of the crucible. It will be evident that a cylindrical, frustoconical or rectangular crucible may be each be sectioned in the vertical plane to provide sections of practical size and excellent quality, and these can be assembled in fluid-tight connection to grow an ingot of arbitrary size limited only by engineering and economic considerations.

Though a crucible which supports the crystal as it grows, leaving a gap in the bottom, provides excellent ingots, even better ingots are obtained if the bottoms of the crucibles are grooved. The term "grooved" is used herein to indicate that how the bottom is "scored" or "serrated" is not critical as long as the profile does not bind the crystal to the bottom. A single groove has a directive effect and will be found to be beneficial, but for obvious reasons, it is preferred to use at least one set of a multiplicity of grooves in parallel relationship with each other.

Figure 6:
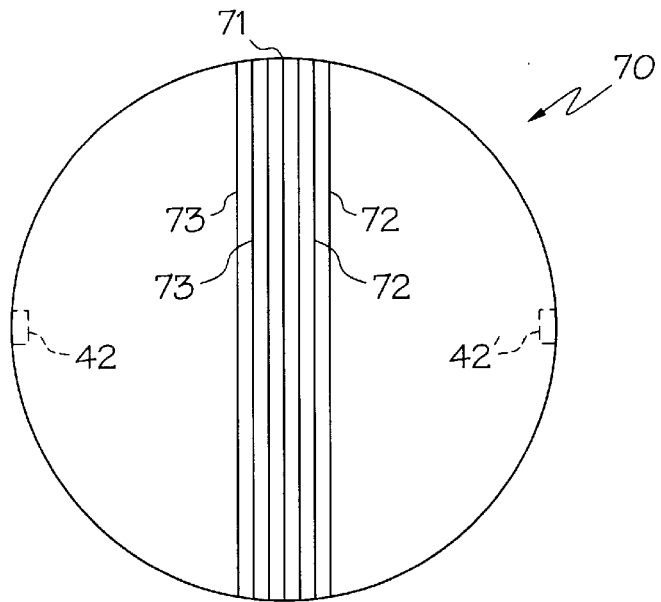
FIG. 6 is a top plan view of the bottom of a frustoconical crucible showing a single groove or serration having a triangular profile (in side elevation) cut into the bottom and overlying its diameter.

Referring to FIG. 6 there is shown a plan view of the circular bottom 70 of a frustoconical crucible such as shown in FIG. 3 which is provided with at least one set of grooves, the central groove 71 lying along the diameter of the bottom, and others 72 and 73 running parallel to groove 71, on either side thereof. The grooves may extend over only a portion of the bottom, but to grow a single crystal, they preferably cover the entire bottom. Grooves range in depth from about 0.8 mm (0.03125 in) to about 4.7 mm (0.1875 in), preferably from about 1.6 mm (0.0625 in) to about 3.2 mm (0.125 in).

As an alternative to machining grooves, the bottom of the crucible may be coated with a thin coating of graphite cement in the range from about 0.8 mm to about 3.2 mm thick; the coating is then grooved before the crucible is fired in vacuum to develop a permanent bond. After firing the crucible it is preferred to remove impurities with a purification treatment, avoiding the use of nitrate or nitric acid which tends to form a graphitic oxide and make the surface wettable. Using a coating of graphite is particularly desirable in a sectioned crucible, to seal its bottom against leakage.

Figure 6A:
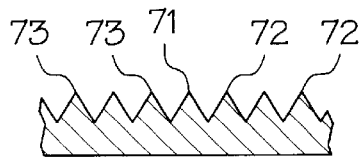
FIG. 6A is an end elevational detail view of multiple triangular grooves across the bottom of a crucible.
Figure 6B:
FIGS. 6B, 6C, 6D and 6E are detailed views of some other profiles of grooves which function similar to those shown in FIG. 6A.
Figure 6C:
Figure 6D:
Figure 6E:
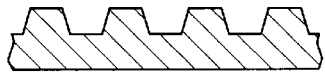

Referring to FIG. 6A there is shown a detailed view of an end elevation of the grooves illustrated in FIG. 6. The grooves are provided by a series of triangle-shaped ridges 71, 72, 73 which help direct the propagation of crystallization and enables a shrinking melt to form the crystallized bottom of an ingot which pulls away from the bottom of the crucible. Though the angular disposition of the grooves relative to the diameter of the bottom directs crystal propagation, it is important that their side elevational profile be such as to allow the crystallized bottom to pull away from the troughs of the grooves without being bound therein. Most preferred is a profile of grooves shown in FIG. 6A as isosceles triangles; any triangular profile is effective unless one of the sides is vertical as shown in FIG. 6B, when the vertical edge of the triangular groove tends to hold the crystal tightly and fracture either the crystal or the crucible. Other profiles for grooves are illustrated in FIGS. 6C–6E. FIG. 6C illustrates sequential cusps; FIG. 6D illustrates a wavy profile; and FIG. 6E illustrates crenelations separated by V-shaped (not shown) or U-shaped (shown) grooves.

More preferred than a single set of parallel grooves are twin sets of grooves angulated with respect to each other at an angle chosen in light of the lattice structure of an ingot to be grown. $CaF_2$, lithium fluoride (LiF) and sodium chloride (NaCl) are all cubic, but $CaF_2$ favors growth in the 100 direction while LiF and NaCl favor growth in the 111 direction. Magnesium fluoride ($MgF_2$) is tetragonal but close enough to fluorite, which favors growth in the 100 direction, referred to as the "C" direction in the tetragonal system.

Figure 7:
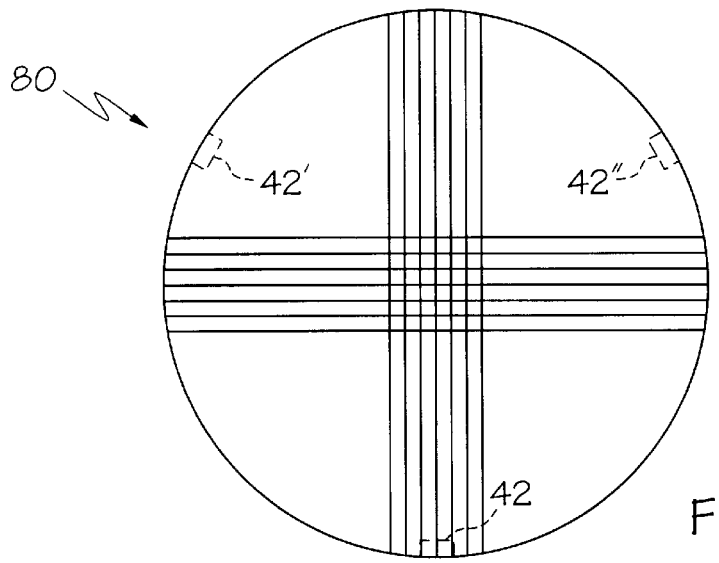
FIG. 7 is a top plan view of the bottom of a frustoconical crucible showing twin sets of grooves, each having a triangular profile (in side elevation), cut at right angles to one another.
Figure 8:
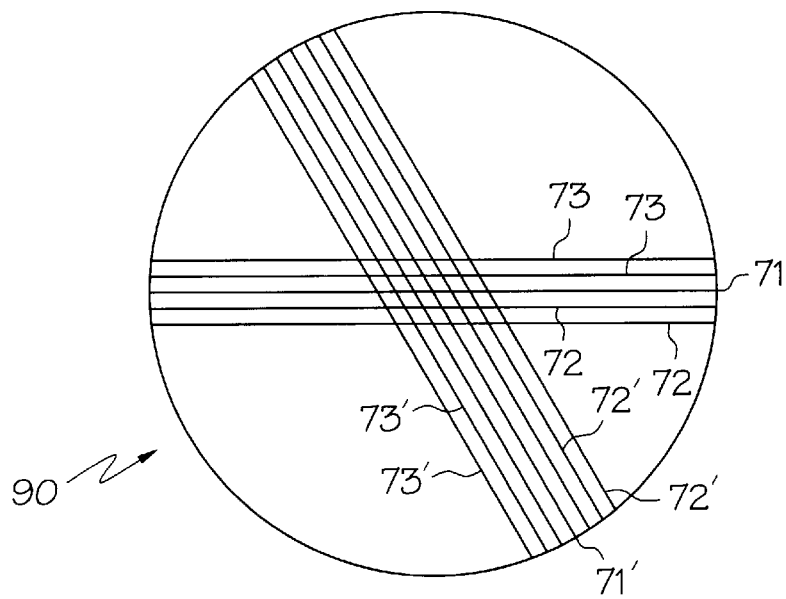
FIG. 8 is a top plan view of the bottom of a frustoconical crucible showing twin sets of grooves, each having a triangular profile (in side elevation), cut at an angle of 60° to one another.

Accordingly, as illustrated in FIG. 7, the bottom of the crucible 80 is provided with twin sets of grooves 71, 72, 73 and 71', 72' and 73', the sets being at right angles to one another for spontaneous seeding in the 100 direction. Spontaneous seeding is desirable because the melt can be overheated about 100° C. to drive off dissolved gases and $Pb^{++}$ which in $CaF_2$ absorbs at 200 nm; in $BaF_2$ the $Pb^{++}$ absorbs at 205 nm. Such absorptions diminish the effectiveness of the crystal as a laser window. As in FIG. 6, the profile of the serrations is not critical.

Where growth of a single crystal ingot is favored at 60°, the grooves are provided at that angle as illustrated in FIG. 8. The bottom of crucible 90 is provided with twin sets of grooves 71, 72, 73 and 71', 72' and 73', the sets being at an angle of 60° to one another. As in FIG. 6, the profile of the serrations is not critical.

For growth of an ingot from a seed held in a seed pocket provided in the bottom of the crucible, the grooves are beneficial but the angle of the grooves is not important. Radially radiating grooves, or spiral grooves, or radially spaced apart circumferential grooves will each be beneficial.

Growing an ingot in a crucible having a bottom with twin sets of grooves as illustrated in FIGS. 7 and 8 will generally provide a single crystal ingot with mosaics in a choice of only three directions. If the ingot grown fails to have a desired mosaic specified for an X-ray plate, the ingot is unusable for its intended purpose, and another ingot must be grown which might have a mosaic with the desired specification. Each time an ingot is grown in a crucible with only one set of twin angulated grooves, there is a choice of only three directions in which one can find the desired mosaic.

Figure 9:
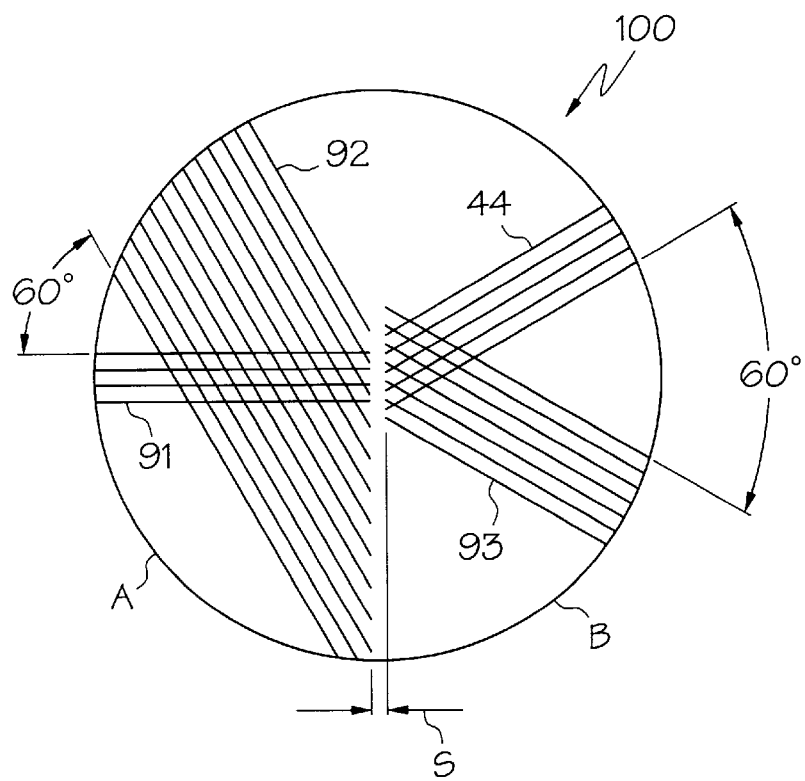
FIG. 9 is a top plan view of the bottom of a frustoconical crucible showing grooves cut in spaced apart patterns, each pattern in a semicircle comprising twin sets of grooves, each having a triangular profile (in side elevation), cut at an angle of 60° to one another.

Referring to FIG. 9 there is schematically illustrated a plan view of a grooved bottom of a crucible 100 in which two single crystals are grown, side by side, each single crystal favoring growth at a 60° angle, so as to provide a total of six directions for choices of obtaining the desired mosaic. Twin sets of grooves are provided in laterally spaced apart semicircular portions A and B of the bottom, spaced apart by distance 's' on the diameter. Grooves 91, 92 in semicircle A are at an angle of 60° to each other, as are the grooves 93 and 94 in the semicircle B, except that the grooves in each semicircle are inclined to one another at an angle other than 60° so that the grooves in one set are staggered relative to the other, and therefore mismatched. The relative angle at which the grooves in each set are staggered is not critical. Though the ingot is deliberately grown as separate single crystal halves, the ingot is optically integral and its contiguous lattices are differently oriented one relative to the other. Since each set of grooves provides a single crystal with a choice of mosaic in three directions, an ingot grown with side by side single crystals provides twice as many choices. Therefore if such an ingot is sawed in half along the boundary of the contiguous lattices, each half may be evaluated for mosaic spread by X-ray diffraction in various directions. Thus at least one half of the ingot is likely to have the desired mosaic spread.

Using the novel crucible of this invention it is now possible to practice a novel process comprising, charging a crucible with a halide of Group 1$a$ and Group 2$a$ element of the Periodic Table which halide forms a shrinking melt upon being sufficiently heated in a furnace, the crucible having transversely spaced indentations in the interior surface thereof sufficient to support a macrocrystal grown therein near its edges; causing slow movement of the melt relative to the furnace from a region hotter than the melt's crystallization temperature to a region cooler than the crystallization temperature; maintaining a temperature gradient in a localized zone between melt and solid; supporting a mass of partially crystallized melt on said indentations; and, forming an ingot having its bottom surface spaced apart from the interior bottom surface of the crucible.

Example 1

A stepped crucible of dense 9RL graphite (obtained from Airco Carbon) having stepped walls of the general configuration illustrated in FIG. 3 is charged with 450 parts of $CaF_2$ and 10 parts of $PbF_2$ crystals, by weight and placed in a furnace such as is illustrated in FIG. 1. The furnace is evacuated to a pressure of less than 0.1 mm Hg absolute, and heat is applied in the hot zone over an 18 hr period until all gassing ceases and the charge forms a substantially homogenous melt. When crystallization commences the crucible is lowered slowly into a cooler zone at a rate of about 4 mm per hr and continued for about 24 hr, making adjustments for power requirements as necessary. The position of the probe at the interface remained essentially constant indicating that no sudden power requirements were necessary. At no time was there any indication that the growing crystal had moved within the crucible. The elevator is then stopped and the temperature of the crucible allowed to cool to room temperature. The ingot is supported on the steps of the crucible and because the periphery of the ingot is not adhered to the walls, the ingot is lifted out of the crucible. The ingot is found to be clear and optically integral but contained several single crystals.

Example 2

The interior surface of the bottom of a frustoconical crucible having smoothly tapered walls free of indentations, and made of the same 9RL graphite as before, is machined so as to cover the entire bottom with twin sets of triangular grooves shown in FIG. 6A, at right angles to one another as shown in FIG. 7. The crucible was charged with a $CaF_2$/$PbF_2$ charge as before, and an ingot is grown in a manner analogous to that described in Example 1 above, making power adjustments as required. The position of the probe at the interface did not remain essentially constant and sudden power requirements are necessary. After about 10 hr there is an indication that the growing crystal moved within the crucible, coming to rest on the bottom. The ingot is found to be a clear and optically integral single crystal.

Example 3

The bottom of a stepped crucible of dense 9RL graphite having stepped walls of the general configuration illustrated in FIG. 3 is machined so as to cover the entire bottom with twin sets of triangular grooves shown in FIG. 6A, at right angles to one another as shown in FIG. 7. The crucible is charged with a $CaF_2$/$PbF_2$ charge as before, and an ingot is grown in a manner analogous to that described in Example 1 above, making power adjustments as required. The position of the probe at the interface remained essentially constant indicating that no sudden power requirements were necessary. At no time was there any indication that the growing crystal had moved within the crucible. The ingot is supported on the steps of the crucible and because the periphery of the ingot is not adhered to the walls, the ingot is lifted out of the crucible. The ingot is found to be a clear and optically integral single crystal Having thus provided a general discussion, described the special-purpose crucible in detail and illustrated it with specific examples of the best mode of making it, it will be evident that the invention has provided an effective solution to a specific problem. It is therefore to be understood that no undue restrictions are to be imposed by reason of the specific embodiments illustrated and discussed, and particularly that the invention is not restricted to a slavish adherence to the details set forth herein.

I claim:

1. In a crucible for growing a macrocrystal from a melt, said crucible being formed from a heat resistant and thermally conductive material which is substantially impermeable to said melt which fails to wet the crucible's interior surface, the improvement comprising, said crucible's interior surface having at least one interior dimension greater than 7.5 cm, and, said interior surface has two transversely spaced apart indentation means having a configuration adapted to support said macrocrystal near its edges and maintain said macrocrystal's bottom in spaced apart relationship with said crucible's bottom, wherein said macrocrystal is greater than about 7.5 cm at its widest lateral dimension, and wherein said bottom has at least one groove formed therein to direct propagation of growth of said macrocrystal.

2. The crucible of claim 1 wherein said bottom has a set of multiple grooves in parallel relationship relative to each other.

3. The crucible of claim 1 wherein said bottom has twin sets of multiple grooves each first and second set having grooves in parallel relationship relative to each other, grooves of said first set being disposed at an angle to grooves of said second set.

4. The crucible of claim 3 wherein said first set is at an angle of 90° to said second set.

5. The crucible of claim 3 wherein said first set is at an angle of 60° to said second set.

6. The crucible of claim 1 wherein said groove has a triangular profile in side elevation, said profile facilitating separation of said macrocrystal's bottom from said crucible's bottom.

7. A crucible for growing a macrocrystal of a halide of Group 1a and Group 2a element of the Periodic Table by controlling the heat absorbed by the crucible, comprising, said crucible having at least a pair of transversely spaced apart indentations in walls of said crucible, said indentations providing sufficient support for said macrocrystal near its edges so as to maintain said macrocrystal's bottom in spaced apart relationship with said crucible's bottom, wherein said indentation means are in opposed walls of said crucible, wherein said indentation means are selected from steps protruding into the interior wall of said crucible, and a circumferential channel recessed for a distance in the range from about 0.1% to about 1.5% of the distance between said indentation means, wherein said bottom has at least one groove formed therein to direct propagation of growth of said macrocrystal.

* * * * *